United States Patent [19]

Gardner

[11] Patent Number: 5,756,383
[45] Date of Patent: May 26, 1998

[54] METHOD OF MANUFACTURING AN ACTIVE REGION OF A SEMICONDUCTOR BY DIFFUSING A COUNTERDOPANT OUT OF A SIDEWALL SPACER

[75] Inventor: Mark I. Gardner, Cedar Creek, Tex.

[73] Assignee: Advanced Micro Devices, Austin, Tex.

[21] Appl. No.: 772,729

[22] Filed: Dec. 23, 1996

[51] Int. Cl.$^6$ .............................................. H01L 21/8238
[52] U.S. Cl. ...................... 438/231; 438/307; 438/919
[58] Field of Search .................................. 437/34, 44, 57, 437/160, 164; 438/919, 231, 307, 305

[56] References Cited

U.S. PATENT DOCUMENTS

| | | |
|---|---|---|
| 4,356,623 | 11/1982 | Hunter . |
| 4,837,179 | 6/1989 | Foster et al. ............................. 437/44 |
| 5,254,866 | 10/1993 | Ogoh ....................................... 257/369 |
| 5,504,024 | 4/1996 | Hsu ........................................... 437/44 |

OTHER PUBLICATIONS

S. Wolf, *Silicon Processing for the VLSI Era*, vol. 2: Processing Integration, pp. 354–363 and 437–439, copyright 1990.

*Primary Examiner*—John Niebling
*Assistant Examiner*—Richard A. Booth
*Attorney, Agent, or Firm*—Merchant, Gould, Smith, Edell, Welter & Schmidt, P.A.

[57] ABSTRACT

A semiconductor device fabrication process in which an active region of a semiconductor device is formed by diffusing a dopant out of a sidewall spacer. According to the process, a gate electrode is formed on a substrate and an active region of the substrate adjacent the gate electrode is doped with a first dopant of a first conductivity type to form a heavily-doped region in the active region. A spacer layer having a second dopant disposed therein is then formed. The second dopant has a second conductivity type opposite of the first conductivity type. Portions of the spacer layer are removed to form a spacer containing the second dopant on a sidewall of the gate electrode. The second dopant is diffused out of the spacer into a portion of the heavily-doped region to form a lower conductivity region in the active region. The lower conductivity region may form an LDD region of an LDD structure.

20 Claims, 4 Drawing Sheets

METHOD OF MANUFACTURING AN ACTIVE REGION OF A SEMICONDUCTOR BY DIFFUSING A COUNTERDOPANT OUT OF A SIDEWALL SPACER

FIELD OF THE INVENTION

The present invention is directed generally to a method of manufacturing a semiconductor device and, more particularly, to a method of forming an active region of a semiconductor device by diffusing a counterdopant out of a sidewall spacer.

BACKGROUND OF THE INVENTION

Over the last few decades, the electronics industry has undergone a revolution by the use of semiconductor technology to fabricate small, highly integrated electronic devices. The most common and important semiconductor technology presently used is silicon-based. A large variety of semiconductor devices have been manufactured having various applications in numerous disciplines. One such silicon-based semiconductor device is a metal-oxide-semiconductor (MOS) transistor.

Figure 1:
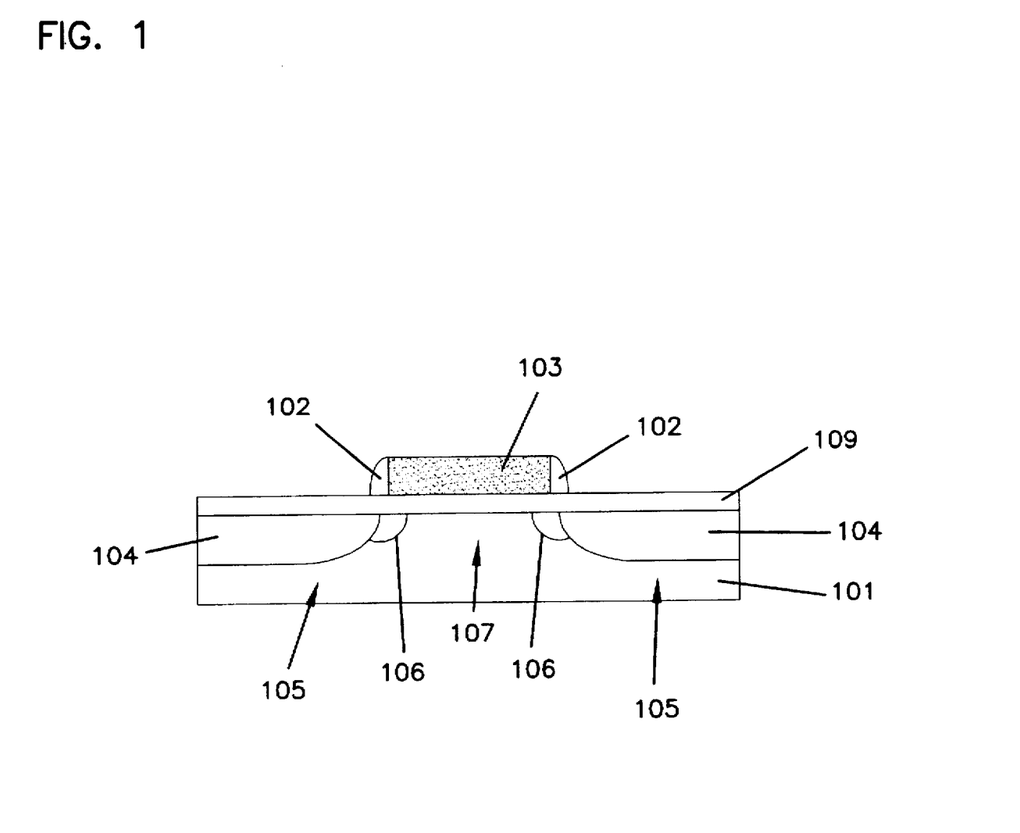
FIG. 1 illustrates one typical MOS semiconductor device structure.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily-doped source/drain regions 105 are formed in the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

The source/drain regions 105, illustrated in FIG. 1, are lightly-doped-drain (LDD) structures. Each LDD structure includes a lightly-doped, lower conductivity region 106 near the channel region 107 and a heavily-doped, higher conductivity region 104 typically connected to the source/drain terminal. Generally, the LDD structures are typically formed by: implanting a first dopant into active regions adjacent the gate electrode at relatively low concentration levels to form the lightly-doped regions 106; forming spacers 108 on the gate electrode; and implanting a second dopant into the active regions at higher concentration levels to form the heavily-doped regions 104. The substrate is then annealed to drive the dopant in the heavily-doped regions deeper into the substrate 106.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

Semiconductor devices, like the one described above, are used in large numbers to construct most modern electronic devices. As a larger number of such devices are integrated into a single silicon wafer, improved performance and capabilities of electronic devices can be achieved. In order to increase the number of semiconductor devices which may be formed on a given surface area of a substrate, the semiconductor devices must be scaled down (i.e., made smaller). This is accomplished by reducing the lateral and vertical dimensions of the device structure.

The depth and extent of lateral diffusion of the LDD region are important dimensions which must be scaled down as the device structure is made smaller. Lateral diffusion of the dopant used to form the LDD region shortens the effective length of the channel region and consequently limits the ability to scale down the semiconductor device. Lateral diffusion of the LDD region dopant often occurs during processing in fabrication steps subsequent to LDD region formation, including the annealing step used to drive-in the dopants of the heavily-doped, higher conductivity region. A more detailed description of LDD source/drains and the fabrication thereof may be found in S. Wolf, *Silicon Processing for the VLSI Era*, Vol. 2: Processing Integration, pp. 354–363 and 436–439.

SUMMARY OF THE INVENTION

Generally, the present invention relates to a semiconductor device manufacturing method in which a low conductivity region of an active region of a semiconductor device is formed by diffusing a dopant out of a sidewall spacer.

In one embodiment of the invention, a gate electrode is formed on a substrate and an active region of the substrate adjacent the gate electrode is doped with a first dopant of a first conductivity type to form a heavily-doped region in the active region. A spacer layer having a second dopant disposed therein is then formed. The second dopant has a second conductivity type opposite of the first conductivity type. A portion of the spacer layer is removed to form a doped spacer, containing the second dopant, on a sidewall of the gate electrode. The second dopant is diffused out of the spacer into a portion of the heavily-doped region to form a lower conductivity region in the active region. The lightly-doped region may form an LDD region of an LDD structure.

In another embodiment of the invention, a process is provided for forming a semiconductor device, having a first device region of a first conductivity type and a second device region of a second conductivity type different than the first conductivity type. According to the process, at least one gate electrode is formed on each of the first and second device regions. An active region of the first device region is then selectively doped with a first dopant of the first conductivity type to form a first heavily-doped region. A spacer layer containing a second dopant of the second conductivity type is formed over the first and second device regions. A portion of the spacer layer is removed to form a spacer on the sidewall of the gate electrode of each of the first and second device regions. An active region of the second device region is selectively doped with a dopant of the second conductivity type to form a second heavily-doped region. The second dopant is diffused out of the spacer on the gate electrode of the first device region into a portion of the first heavily-doped region reducing the conductivity of the first heavily-doped region of the first device region to form a first lower conductivity region. The second dopant is also diffused out of the spacer on the gate electrode of the second device region to form a second lower conductivity region adjacent the second heavily-doped region.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices, including in particular MOS structures. While the present invention is not so limited, an appreciation of various aspects of the invention will be gained through a discussion of the fabrication process and characteristics of such a device in connection with the examples provided below.

Figure 2A:
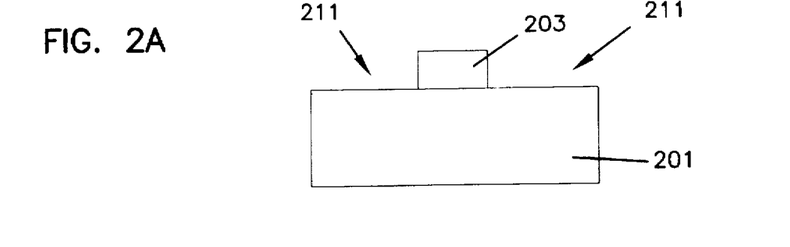
FIGS. 2A–2E illustrate a fabrication process in accordance with one embodiment of the invention.

FIGS. 2A–2E illustrate a process for fabricating a lower conductivity region of an active region of one conductivity type by diffusing a dopant of the opposite conductivity type out of a sidewall spacer. Using known techniques, gate electrodes (only one of which is shown) are formed on a substrate 201. The gate electrode 203 is typically insulated from the substrate 201 by a thin oxide layer (not shown). The resultant structure is illustrated in FIG. 2A. It will be appreciated that a number of different known fabrication techniques could be used to obtain the gate electrode structure depicted as FIG. 2A.

Figure 2B:
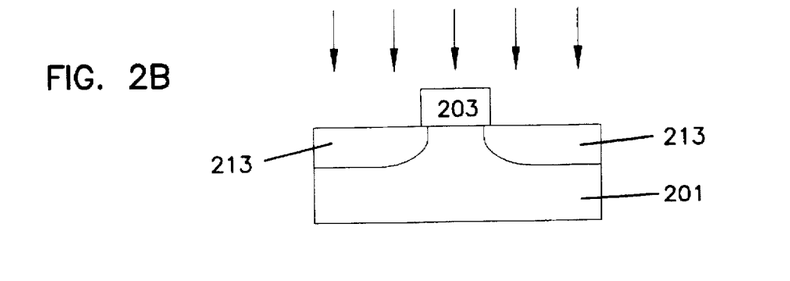
Figure 2C:
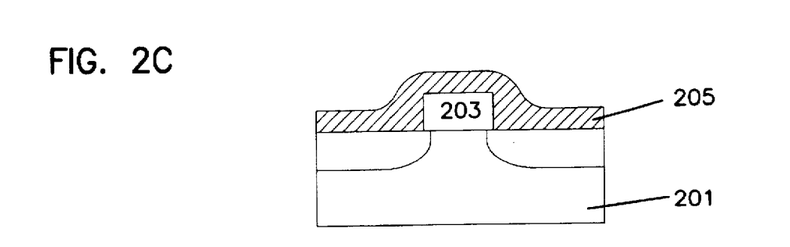
Figure 2D:
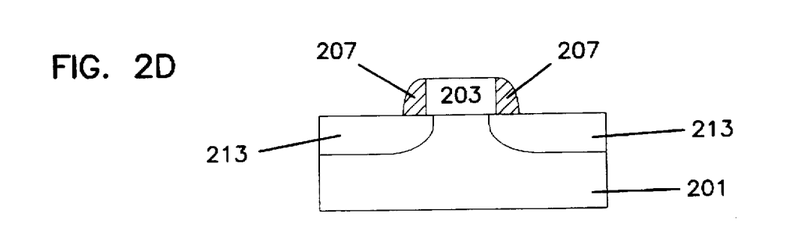
Figure 2E:
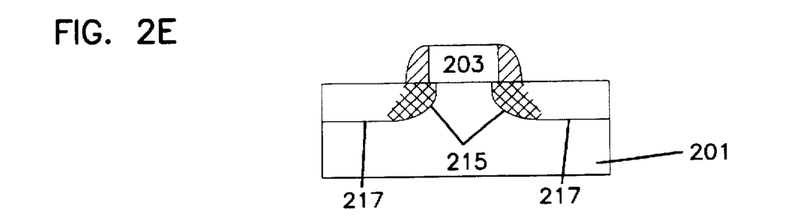

Portions of the semiconductor substrate 201 which lie adjacent the gate electrode 203 generally define active regions 211 of the substrate 201. As used herein, the term active region encompasses a region where an active portion of the device resides whether the active portion has been or will be formed. The active regions 211 may serve, for example, as source/drain regions of a semiconductor device. In the illustrative embodiment of FIGS. 2A–2E, the active regions 211 serve as LDD structures. An LDD structure is illustrated in FIG. 2E.

The active region 211 is doped, for example, by implantation, with dopant to form heavily-doped regions 213 in the active region 211. The resultant structure is illustrated in FIG. 2B. In a p-type MOS (PMOS) device, the heavily-doped region 213 may be formed from a p-type dopant, such as boron. In an n-type MOS (NMOS) device, the heavily-doped region 213 may be formed from an n-type dopant such as arsenic or phosphorous.

At this point, in one embodiment, the dopant is additionally driven further into the substrate 201 by annealing. This may be done to reduce the temperature or duration of the heating steps used to form LDD regions as will be discussed below.

A spacer layer 205, containing a dopant of an opposite conductivity type than the dopant used to form the heavily-doped region 213, is formed over the substrate 201 and the gate electrode 203. The dopant is used to form a low conductivity region as will be described below, and the dopant concentration is suitably selected based on the desired profile of this low conductivity region. In an NMOS device, the doped spacer layer 205 typically contains a p-type dopant such as boron, while in PMOS devices the dopant is an n-type dopant such as arsenic or phosphorous. The resultant structure is illustrated in FIG. 2C.

The doped spacer layer 205 is formed by depositing a predoped material, for example a boron-doped oxide in the case of an NMOS device, over the substrate 201 and gate electrode 205. In an alternate embodiment, the spacer layer 205 is first formed over the substrate 201, for example, by depositing or growing a film, and then the desired dopant is implanted or diffused into the film to form the spacer layer 205. In another alternate embodiment, the spacer layer 205 is formed by depositing a spacer layer material, such as $SiO_2$, and the desired dopant at the same time. The depth of the spacer layer 205 generally varies with design parameters, such as desired channel length and gate electrode spacing. A suitable spacer layer depth typically ranges from about 500 to 2000 angstroms (Å).

Portions of the doped spacer layer 205 are removed to form doped spacers 207 on the sidewalls of the gate electrode 203. Conventional etching techniques may be used to remove the portions of the spacer layer 203. The resultant structure illustrated in FIG. 2D includes heavily-doped regions 213 of one conductivity type generally aligned with the gate electrode. Doped spacers 207 containing a dopant of an opposite conductivity type to that of the heavily-doped regions 213 are disposed on the sidewalls of the gate electrode 203 overlapping a portion of the heavily-doped regions 213. Using subsequent thermal processing, the spacer dopant is diffused out of the doped spacers 207 to reduce the conductivity of the underlying portions of the heavily-doped regions 213. In this manner, lower conductivity regions, such as LDD regions, are formed as will be discussed more fully below.

In an alternate embodiment, spacers can be formed having an outer undoped portion and an inner doped portion adjacent the gate electrode by using two types of spacer layers, namely, a doped layer as described above and an undoped layer. These spacers can serve any number of desired purposes. For example, the undoped portion can be used to widen the spacers to, for example, further isolate the exposed active region and gate electrode and facilitate silicidation or to further cover the source/drain region in preparation for another dopant implant. Additionally, the spacers having an outer undoped portion can be used to encapsulate the dopant within the inner portion of the spacer thereby inhibiting the dopant from escaping into the environment.

In another alternate embodiment, spacers can be formed having an outer doped portion and an inner undoped portion adjacent the gate electrode by forming and removing an undoped layer on top of a doped layer as described above. The inner undoped portion can be used to widen the spacer for the reasons discussed above. In addition, spacers having an outer doped portion can be used, for example, to pull the doped portion of the spacer away from the gate electrode if desired. Spacers having multiple doped and undoped portions can be formed with multiple layers if desired.

Following spacer formation, the dopant in the doped spacers 207 is diffused into the heavily-doped regions 213 of the substrate 201 to reduce the conductivity of the underlying regions. Specifically, the dopant outdiffused from the doped spacers 207 (having a conductivity opposite that of the heavily-doped regions 213) counterdopes or counteracts the dopants in portions of the highly-doped regions 213 to form lower conductivity regions 215 on the channel side of the heavily-doped regions 213. Higher conductivity regions 217 remain away from the channel side of the heavily-doped regions 213, as illustrated in FIG. 2E. The lower conductivity regions 215 result from the counterdoping provided by the spacer dopant. Together the lower conductivity regions 215 and the higher conductivity regions 217 form LDD structures with the lower conductivity regions 215 being disposed between the higher conductivity regions 217 and the gate electrode 201 and extending beneath the gate electrode 201 a short distance, as illustrated in FIG. 2E. The formation of the LDD structures may be followed by further processing techniques such as silicidation, interconnect formation, and so forth, to complete the device structure.

The dopant is diffused out of the doped spacers 207 by subjecting the substrate 201 to a thermal process such as annealing. Such spacer dopant diffusion may be accomplished by a substrate anneal performed to both drive-in the dopants of the higher conductivity regions 217 and sufficiently diffuse the spacer dopants to form lower conductivity regions 215. In one embodiment, the dopant is outdiffused from the doped spacers 207 using rapid thermal processing, a process in which the substrate 201 is subjected to a relatively high temperature for a relatively short time, in order to finely control dopant diffusion.

By using the above process, the lateral distance by which the gate electrode overlaps the LDD region is reduced and smaller semiconductor devices can be formed. For example, during typical LDD source/drain formation, an LDD implant implants a dopant into the substrate a certain initial vertical and lateral distance. During subsequent heating of the substrate, the LDD dopant laterally diffuses and reduces the effective length of the channel. A typical LDD region has lateral diffusion ranging from 300 to 500 Å. By forming heavily-doped regions first and then outdiffusing a "counter" dopant having a conductivity type opposite that of the source/drain region, from a spacer using the above process, heating of the substrate causes diffusion of a dopant which counteracts the lateral diffusion of the heavily-doped regions dopant and thus inhibits reduction of the effective channel length. This is particularly true when using a spacer dopant that diffuses more rapidly that the heavily-doped region dopant. In an NMOS device, for example, boron may be used as the spacer dopant and arsenic as the source/drain dopant. Since the boron will diffuse more quickly than the arsenic, the counterdoping from the spacer will effectively offset any lateral diffusion of the arsenic into the channel. It is possible with the above process to form LDD regions having lateral diffusion ranging from 50 to 100 Å.

The above process can be used to form a number of different semiconductor devices, including but not limited to MOS structures such as p-type MOS devices (PMOS), n-type MOS devices (NMOS), and complimentary MOS (CMOS) semiconductor devices having both PMOS and NMOS devices. In a CMOS device, for example, the NMOS device regions may be masked off while the above process is carried out on the PMOS device regions and the PMOS device regions may be masked off while the above process is carried out on the NMOS device regions. Moreover, the above process can be used to form typical LDD structures as well as other LDD structures having lower conductivity regions, such as double implant LDDs, buried LDDs, etc.

Figure 3A:
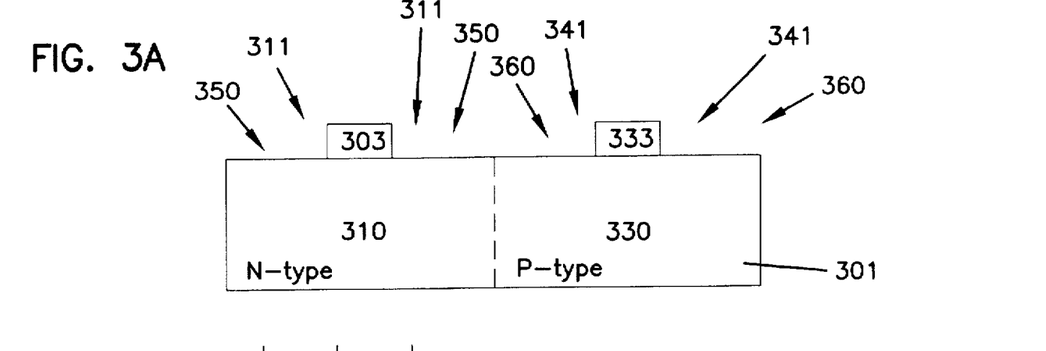
FIGS. 3A–3F illustrate another fabrication process in accordance with another embodiment of the invention.

FIGS. 3A–3H illustrate another embodiment of this invention in which active regions of different channel types of a semiconductor device, such as a CMOS device, are formed using a single doped spacer layer for different purposes on the different channels. Using known techniques, NMOS device regions and PMOS device regions are defined and gate electrodes are formed on a substrate 301 (only one gate electrode for each type of channel is shown). The gate electrodes 303 and 333 are typically insulated from the substrate 201 by a thin oxide layer (not shown). Both the NMOS and PMOS device regions 310 and 330 are associated with active regions 350 and 360 respectively, which are used to form LDD structures, as illustrated in FIG. 3G. The resultant structure is illustrated in FIG. 3A.

The term device region as used herein refers to a region of the substrate associated with a MOS device having a particular type of channel. The channel type, n-type or p-type, of a channel is identified based on the conductivity type of the channel developed under the transverse electric field. This means that an NMOS device region, for example, includes an n-type channel under a transverse electric field and is associated with n-type doped active regions and gate electrode.

Figure 3B:
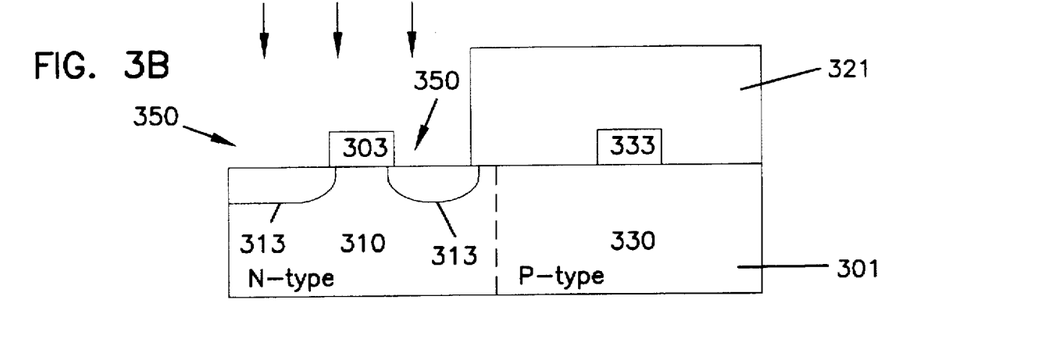

Following formation of the gate electrodes, mask 321 is formed over the PMOS device region 360 of the substrate 301, for example, by developing and selectively removing a photoresist, and a source/drain dopant is implanted into the NMOS device region 310, to form a heavily-doped regions 313 in the NMOS active regions 350. The source/drain dopant may, for example, be arsenic or phosphorous. The resultant structure is depicted in FIG. 3B.

Figure 3C:
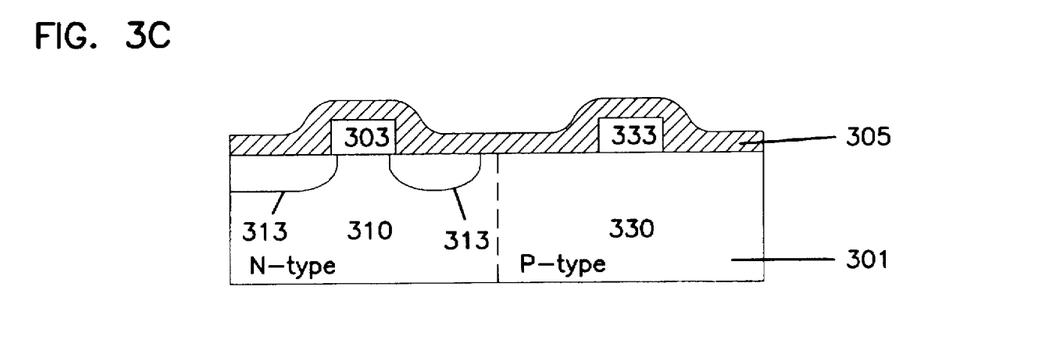
Figure 3D:
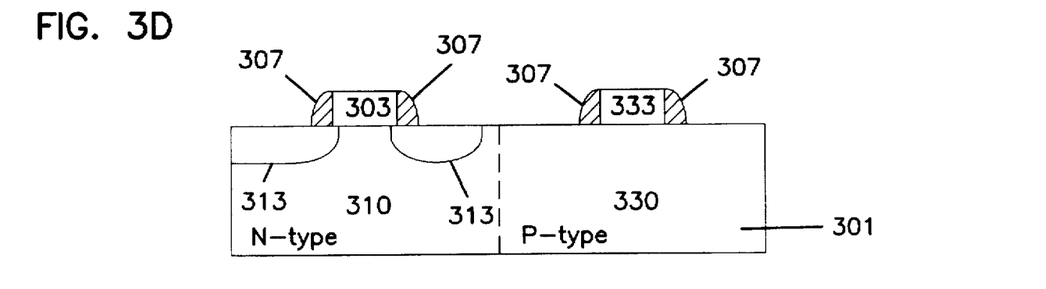

The PMOS mask 321 is then removed and a spacer layer 305 containing a p-type dopant such as boron is formed over both the NMOS and PMOS device regions 310 and 330 of the substrate 301, in a similar manner as described above with respect to FIG. 2C. The resultant structure is illustrated in FIG. 3C. Portions of the doped spacer layer 305 are removed to form doped spacers 307 on the sidewalls of both the NMOS and PMOS gate electrodes 303 and 333. Conventional etching techniques may be used to remove these portions of the spacer layer 303. The resultant structure illustrated in FIG. 3C includes heavily-doped n-type regions 313 aligned with the NMOS gate electrode 303 and p-type doped spacers 307 on the sidewalls of both the NMOS and PMOS gate electrodes 303 and 333, the p-type doped spacers on the NMOS gate electrode 303 being disposed above the heavily-doped n-type regions 313. As will be discussed below, the p-type doped spacers 307 are used to form lower conductivity regions in both the NMOS and PMOS active regions 350 and 360.

Figure 3E:
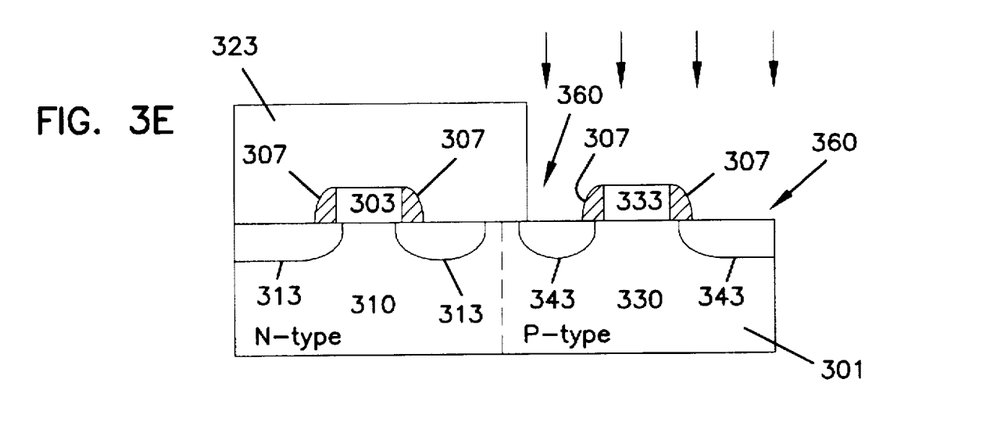
Figure 3F:
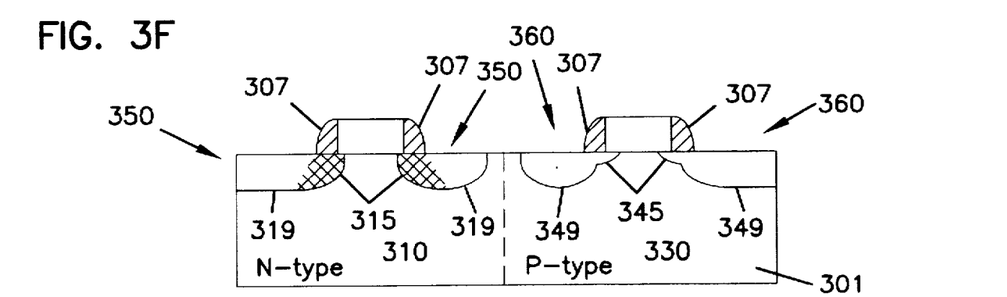

A mask 321 is formed over the NMOS device region 310 of the substrate 301, for example, by developing and selectively removing a photoresist and a source/drain dopant, such as boron, is implanted into the PMOS device region 330, to form heavily-doped regions 333 in the PMOS active region 360. The resultant structure is depicted in FIG. 3E.

The p-type dopant in the doped spacers 307 is then diffused into the substrate 301, for example, by annealing, to form lower conductivity regions 319, 349 in both the NMOS and PMOS active regions 350 and 360. Specifically, the dopant outdiffused from the NMOS doped spacers 307 counterdopes regions of the highly-doped n-type regions 313 to form lower conductivity regions 315 and higher conductivity region 319 in the NMOS active regions 350, as discussed above. In the PMOS active region 360, the p-type dopant outdiffused from the doped spacers 307 increases the concentration of p-type dopant in the PMOS device region 330 to form lightly-doped, lower conductivity p-type regions 335 in the PMOS active region 360. The lower conductivity p-type and n-type regions 315 and 335 lie between their respective higher conductivity regions 319 and 349 and gate electrodes 303 and 333 and extend below their respective gate electrodes 303 and 333 a short distance. Together the lower conductivity regions 315 and 345 and the higher conductivity regions 319, 349 form LDD structures, as illustrated in FIG. 3E. The formation of the LDD structures may be followed by well-known processing techniques such as silicidation, interconnect formation, etc.

The above CMOS fabrication process also reduces lateral diffusion of LDD region dopant and allows for smaller semiconductor devices to be formed. In particular, the lateral diffusion of NMOS LDD region dopant is reduced as described above, while the lateral diffusion of PMOS LDD region dopant is reduced since the PMOS LDD regions are formed by a p-type dopant diffused from the surface of the substrate rather than from a certain depth within the substrate as would be the case with a conventional LDD implant. In addition, particularly with CMOS devices, the above process eliminates the need for two conventional LDD masking steps associated with conventional LDD implants.

As noted above, the present invention is applicable to the fabrication of a number of different devices where an LDD region of an active region is formed by diffusing a dopant out of a spacer. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A process of forming a semiconductor device, comprising:
   forming a gate electrode on a substrate;
   doping an active region of the substrate adjacent a sidewall of the gate electrode with an n-type dopant to form a heavily-doped region in the active region;
   forming a spacer layer having a p-type dopant disposed therein;
   removing a portion of the spacer layer to form a spacer containing the p-type dopant on the sidewall of the gate electrode; and
   diffusing the p-type dopant out of the spacer into a portion of the heavily-doped region to form a lower conductivity region in the active region.

2. The process of claim 1, wherein forming the spacer layer includes depositing a film containing the p-type dopant on the substrate.

3. The process of claim 1, wherein the p-type dopant comprises a boron containing species.

4. The process of claim 1, wherein the diffusing includes heating the substrate.

5. The process of claim 4, wherein the heating includes rapid thermal processing.

6. The process of claim 1, wherein forming the spacer layer includes:
   forming a doped spacer layer containing the p-type dopant on the substrate; and
   forming an undoped spacer layer substantially free of the p-type dopant on the doped spacer layer;
   wherein the spacer includes an outer undoped portion formed from the undoped spacer layer and an inner doped portion formed from the doped spacer layer and disposed adjacent the gate electrode.

7. The process of claim 6, further including doping the active region with a third dopant after forming the spacer.

8. The process of claim 1, further including heating the substrate after doping the substrate with the n-type dopant and prior to forming the spacer layer.

9. A process of forming a semiconductor device having a first device region of a first conductivity type and a second device region of a second conductivity type different than the first conductivity type, the process comprising:
   forming at least one gate electrode on each of the first and second device regions;
   selectively doping an active region of the first device region with a first dopant, of the first conductivity type, to form a first heavily-doped region;
   forming a spacer layer over the first and second device regions after selectively doping the active region of the first device region, the spacer layer containing a second dopant, of the second conductivity type;
   removing a portion of the spacer layer to form a spacer on a sidewall of the gate electrode of each of the first and second device regions;
   selectively doping an active region of the second device region with a third dopant, of the second conductivity type, to form a second heavily-doped region;
   diffusing the second dopant out of the spacer on the gate electrode of the first device region into a portion of the first heavily-doped region reducing the conductivity of the first heavily-doped region to form a first lower conductivity region; and
   diffusing the second dopant out of the spacer on the gate electrode of the second device region to form a second lower conductivity region adjacent the second heavily-doped region.

10. The process of claim 9, wherein the diffusing includes heating the substrate.

11. The process of claim 9, wherein the heating includes rapid thermal processing.

12. The process of claim 9, wherein forming the spacer layer includes:
   forming a doped spacer layer containing the second dopant on the substrate; and
   forming an undoped spacer layer substantially free of the second dopant on the doped spacer layer;
   wherein the spacer includes an outer undoped portion formed from the undoped spacer layer and an inner doped portion formed from the doped spacer layer and disposed adjacent the gate electrode.

13. The process of claim 12, further including doping the active region of the first device region with a third dopant after forming the spacers.

14. A process of forming a complimentary metal oxide semiconductor (CMOS) device having at least one N-type MOS (NMOS) device region and at least one P-type MOS (PMOS) device region, the process comprising:

forming at least one gate electrode on each of the NMOS and PMOS device regions;

selectively doping an NMOS active region of the NMOS device region with a n-type dopant to form a NMOS heavily-doped region;

forming a spacer layer containing a first p-type dopant over the NMOS and PMOS device regions;

removing a portion of the spacer layer to form a spacer on a sidewall of each of the NMOS and PMOS gate electrodes;

selectively doping a PMOS active region of the PMOS device region with a second p-type dopant to form a PMOS heavily-doped region; and diffusing the p-type dopant out of the spacer on the NMOS gate electrodes into a portion of the NMOS heavily-doped region to counterdope the NMOS heavily-doped region thereby forming an NMOS lower conductivity region adjacent the NMOS gate electrode; and diffusing the p-type dopant out of the spacer on the PMOS gate electrodes to form a PMOS lower conductivity region adjacent the PMOS gate electrode.

15. The process of claim 1, wherein forming the spacer layer includes:

forming an undoped spacer layer substantially free of the p-type dopant on the substrate; and forming a doped spacer layer containing the p-type dopant on the undoped spacer;

wherein the spacer includes an outer doped portion formed from the doped spacer layer and an inner undoped portion formed from the undoped spacer layer and disposed adjacent the gate electrode.

16. The process of claim 9, wherein forming the spacer layer includes:

forming an undoped spacer layer substantially free of the p-type dopant on the substrate; and forming a doped spacer layer containing the p-type dopant on the undoped spacer;

wherein the spacer includes an outer doped portion formed from the doped spacer layer and an inner undoped portion formed from the undoped spacer layer and disposed adjacent the gate electrode.

17. The process of claim 9, wherein the first conductivity type is n-type and the second conductivity type is p-type.

18. The process of claim 14, wherein selectively doping the NMOS active region is performed prior to forming the spacer layer.

19. The process of forming a semiconductor device, comprising:

forming a gate electrode on a substrate;

doping an active region of the substrate adjacent a sidewall of the gate electrode with a first dopant, of a first conductivity type, to form a heavily-doped region in the active region;

forming a spacer layer over the substrate after doping the active region of the substrate, the spacer layer having a second dopant disposed therein, the second dopant having a second conductivity type opposite of the first conductivity type;

removing a portion of the spacer layer to form a spacer containing the second dopant on the sidewall of the gate electrode; and diffusing the second dopant out of the spacer into a portion of the heavily-doped region to form a lower conductivity region in the active region.

20. The process of claim 19, further including heating a substrate after doping the substrate with the first dopant and prior to forming the spacer layer.

* * * * *

UNITED STATES PATENT AND TRADEMARK OFFICE
CERTIFICATE OF CORRECTION

PATENT NO. : 5,756,383
DATED : May 26, 1998
INVENTOR(S) : Gardner

It is certified that error appears in the above-identified patent and that said Letters Patent is hereby corrected as shown below:

<u>Column 8,</u>
Line 53: "9" should read --10--.

Signed and Sealed this

Third Day of July, 2001

*Attest:*

NICHOLAS P. GODICI
*Attesting Officer*     *Acting Director of the United States Patent and Trademark Office*